Jan. 18, 1966 F. STERZER 3,230,390

SOLID STATE MICROWAVE AMPLIFIER WITH POWER SOURCE OF SAME FREQUENCY AS INPUT

Filed June 7, 1962 2 Sheets-Sheet 1

INVENTOR

FRED STERZER

BY

B. L. Zangwill

ATTORNEY

INVENTOR
FRED STERZER
BY
B. L. Zangwill
ATTORNEY

United States Patent Office 3,230,390

Patented Jan. 18, 1966

3,230,390

SOLID STATE MICROWAVE AMPLIFIER WITH POWER SOURCE OF SAME FREQUENCY AS INPUT

Fred Sterzer, Princeton, N.J., assignor, by mesne assignments, to the United States of America as represented by the Secretary of the Navy Filed June 7, 1962, Ser. No. 200,897
9 Claims. (Cl. 307—88.5)

The present invention relates to an amplifier, and more particularly relates to a solid state microwave amplifier with a rise time in the millimicrosecond range.

In the prior art, velocity modulation amplifiers or parametric amplifiers were required for the satisfactory amplification of microwaves. Velocity modulation amplifiers, such as the Klystron and the traveling wave tube, require the production of a beam of electrons in an evacuated space and the controlled acceleration of these electrons. Therefore, vacuum techniques are essential in the use of velocity modulation amplifiers. For operation, parametric amplifiers require voltage sources of different frequencies.

It is a purpose of this invention to provide a microwave amplifier which does not require vacuum techniques or power sources of different frequencies.

It is a more specific object of this invention to provide a solid state microwave amplifier which has a rise time in the order of a millimicrosecond.

Other objects and many of the attendant advantages of this invention will be readily appreciated as the same becomes better understood by reference to the following detailed description when considered in connection with the accompanying drawings wherein.

Figure 1:
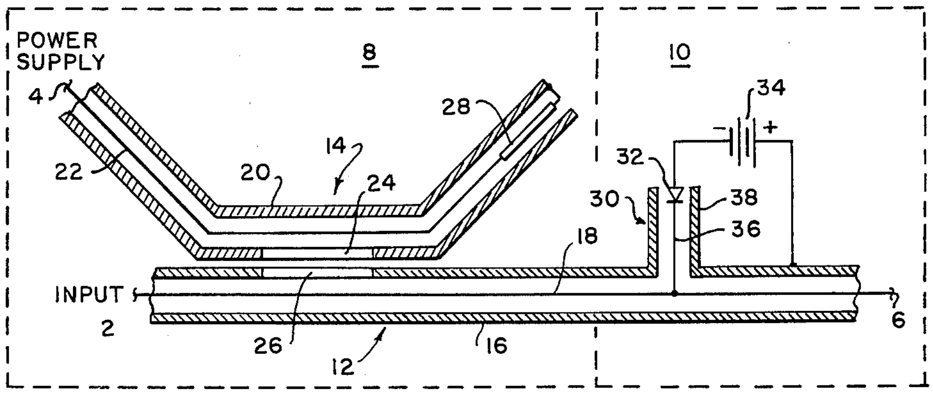
FIG. 1 is a schematic drawing, partly in cross section, showing the entire amplifier in accordance with the invention.

Referring now in particular to FIG. 1 of the drawings, the input to the amplifier is shown at 2 and the output at 6. The microwave power supply is connected to terminal 4. The amplifier is composed of the directional coupler shown generally at 8 and an expander shown generally at 10.

In the embodiment of FIG. 1 the directional coupler 8 contains parallel wave guides 12 and 14. Wave guide 12 is comprised of conductor 16 coaxially surrounding conductor 18. Wave guide 14 is comprised of conductor 20 coaxially surrounding conductor 22. The coaxial conductors 12 and 14 are not cylindrical, but must have a flat planar base between the two wave guides. Each of these coaxial conductors has an aperture on its flat side. These apertures, 26 and 24 are placed side by side. The wave guide 14 is terminated with resistance 28, which is of such a value that substantially no wave signal energy is developed in the region of aperture 24 in response to a pure traveling wave. This impedance is equal to the characteristic impedance of the wave guide 14. The wave guide 12 is connected to the expander 10.

The expander 10 contains a continuation of the wave guide 12 and a branch line 30, terminated with crystal diode 32, which is biased in the backwards direction by D.C. source 34. The branch line 30 consists of inner conductor 36 which is connected to conductor 18 of wave guide 12, an outer coaxial conductor 38 which is connected to outer conductor 16 of wave guide 12. The cathode of crystal diode 32 is connected to inner conductor 36 and the anode is connected to the negative pole of D.C. source 34. The positive pole of D.C. source 34 is connected to the outer conductor 16 of wave guide 12, although it could be connected to the outer conductor 38 of branch line 30.

The operation of the expander will be explained more fully with reference to FIG. 2. The crystal diode 32 is reverse-biased by the battery 34. Since the bias voltage applied to this diode has a backwards direction, that is, with a polarity tending to cause current flow in the diode in the back direction, substantially no current will flow through the diode.

Figures 4, 5:
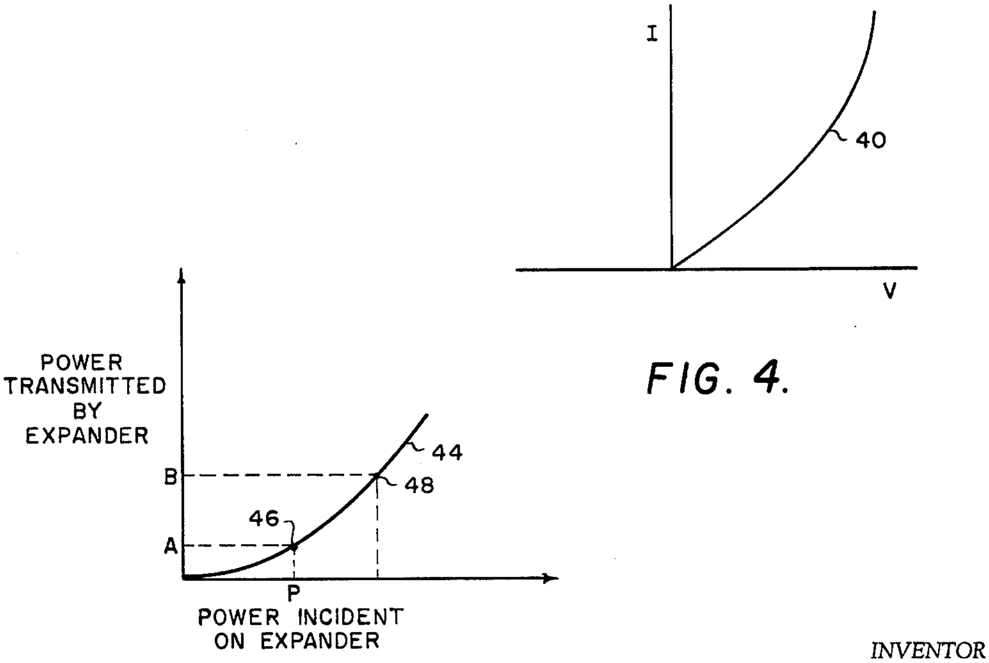
FIG. 4 is the current-voltage characteristic of a crystal diode and is useful in explaining the operation of the expander of FIG. 2.
FIG. 5 is a graph of the power incident on the expander of FIG. 2 against the power transmitted by the expander and is useful in explaining the operation of the amplifier of FIG. 1.

The current-voltage characteristic for the diode is shown in FIG. 4. It can be seen from this curve that if there is no input voltage or if the input voltage is at a low amplitude the diode will not conduct. A common path for return to the line 18 from the diode may be provided in conventional manner, such as by a resistor or through the internal impedance of the load. As the power output to the expander on line 18 is increased the diode will be forced into the conduction region.

The branch line 30 is an odd number of quarter wave lengths long. Consequently, the impedance at junction 42 looking into the branch line will be the inverted terminal impedance of the branch. When the diode 32 is driven into conduction, the branch line 30 will be short circuited and the impedance at 42 will appear to be very large. When the diode 32 is not in its conductive region, the branch line 30 will appear as an open line and the impedance from junction 42 will appear to be negligible.

Consequently, when the radio frequency input to the expander is insufficient to drive the diode 32 into its conduction region, the branch line 30 will appear as a short circuit and the power input to the expander will be reflected. Therefore, the power input to the expander will be greatly attenuated in this condition. When the radio frequency power input to the expander is sufficient to drive the diode 32 into its conductance region, the branch line 30 will have a very large impedance and the power will be passed to the output of the expander. Therefore, for this greater value of input radio frequency there will be much less attenuation in the expander.

This can be better seen with reference to FIG. 5 in which the power transmitted by the expander is plotted against the power incident upon the expander by curve 44. The point 46 on this curve represents a power incident on the expander which is insufficient to drive the diode 32 into conduction while the point 48 represents a point of incident power sufficient to drive the diode 32 into conduction. It can be seen on the curve 44 that low input powers are attenuated to a much greater extent then the larger input powers. In actual operation doubling the input power to the expander may result in the output power being increased by approximately ten times.

If the diode 32 is of a Zener type and the backward bias is midway between its breakdown point and zero bias an improved effect may be obtained. This effect is probably due to the diodes being driven into conduction on both swings of the radio frequency voltage when a wave of sufficient power amplitude is applied.

A directional coupler, shown generally as 8 in FIG. 1, is connected to the expander. The input signal is applied to this directional coupler. The directional coupler and radio frequency power supply will amplify the input signal, as will be explained in more detail with reference to FIG. 6. A radio frequency power supply of the same frequency and phase as the input signal is shown at 4. This radio frequency signal is applied to the wave guide 14. The outer conductor 20 and the inner conductor 22 of the wave guide 14 are terminated with resistor 28 which is chosen to be of such a value as to render the wave guide reflectionless. The wave guide 14 is parallel to the wave guide 12, and the outer conductor 20 of the wave guide 14 is placed adjacent to the outer conductor 16 of wave guide 12. The adjacent sides of the two outer conductors are planar and contain an aperture which is one quarter of a wave length long. This aperture permits the coupling of the magnetic and electric fields with the inner conductor 22 of wave guide 14 and the inner conductor 18 of wave guide 12.

Figure 6:
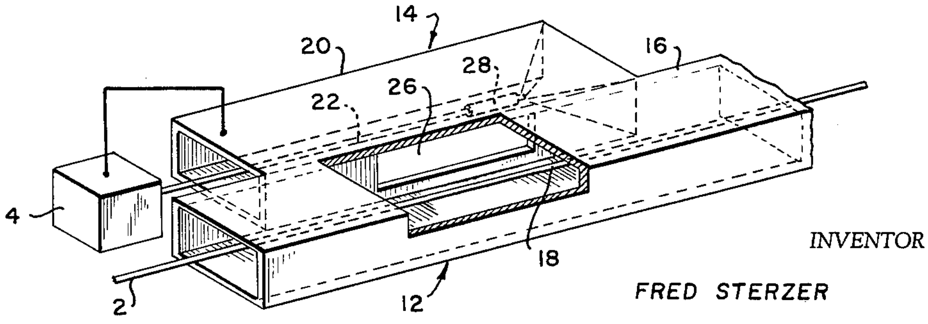
FIG. 6 is a perspective view, partially broken out, of a directional coupler that may be used in this invention.

The slot 26 in outer conductor 20 and the slot 24 in outer conductor 16, as shown in FIG. 1, are placed side by side to provide a common, intercommunicating, longitudinal aperture between the two wave guides 14 and 12. The outer conductors 20 and 16 may have a common side, as shown in FIG. 6 with a single slot 26 in it. A slot length of one quarter of a wave length will provide the maximum coupling of the magnetic and electric fields.

The co-efficient of mutual inductance or magnetic coupling is equal in magnitude to the co-efficient of capacitive coupling or electric coupling but 180° out of phase. Consequently, traveling waves induced in wave guide 12 from the radio frequency power supply transmitted to wave guide 14 at the point of the apertures will cancel out in one direction and reinforce themselves in the other direction in wave guide 12. It can be seen then that the power induced in wave guide 12 by the electric field of wave guide 14 and the power induced by wave guide 12 by the magnetic field from wave guide 14 will travel in only one direction. Of course, many other kinds of directional couplers may be substituted for the preferred embodiment of FIG. 6.

The power induced in wave guide 12 is a non-linear function of the signal input at terminal 2, providing that the power supply 4 delivers energy of the same phase and frequency. The power, P, which would result at the output of the directional coupler with no input signal is increased by the input signal due to the superposition of the electric fields from the power supply and from the input signal.

Figure 2:
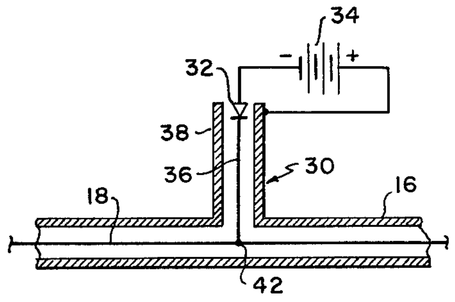
FIG. 2 is a schematic drawing, partly in cross section, and illustrating an expander utilized in the amplifier.

If the power supply 4 is not transmitting power, an input signal, Q, would also be passed through the expander circuit of FIG. 2. However, an input signal at terminal 2 in the presence of a radio frequency signal from the power supply 4 will result in an output which is equal to $P+Q+2\sqrt{PQ}$ which is derivable as follows: Recognizing that power is proportional to the square of electric potential or voltage, the electric field $E_p$, due to input P is $$E_p=\sqrt{P}$$

and the field $E_Q$ due from Q is $$E_Q=\sqrt{Q}$$

The total electric field due from each input is $$E_t=E_p+E_Q$$

or $$\begin{aligned} P_t &= (E_t)^2 \\ &= (E_p+E_Q)^2 \\ &= (\sqrt{P}+\sqrt{Q})^2 \\ &= P+Q+2\sqrt{PQ} \end{aligned}$$

It can be seen from this that the output signal increases non-linearly with the input signal from the terminal at 2. The signal is passed to the expander circuit of FIG. 2, which acts as a non-linear attenuator. The power supply to the directional coupler may be adjusted in magnitude so that the input to the expander P will be attenuated such that there is a negligible output from the amplifier. The non-linear gain which results from an input signal to the directional coupler will be attenuated by the expander in such a way as to increase the non-linearity. This can be seen by again referring to FIG. 5, which is a graph of power transmitted by the expander with respect to the power incident upon the expander. The power P incident on the expander will intercept this curve at point 46 resulting in a power output, A, whereas the power output from the directional coupler in the presence of a signal, $P+Q+2\sqrt{PQ}$, will intercept the curve at point 48 resulting in a much increased power B. The power B–A may be larger than the power Q, providing P is much larger than Q so that net gain is produced.

Figure 3:
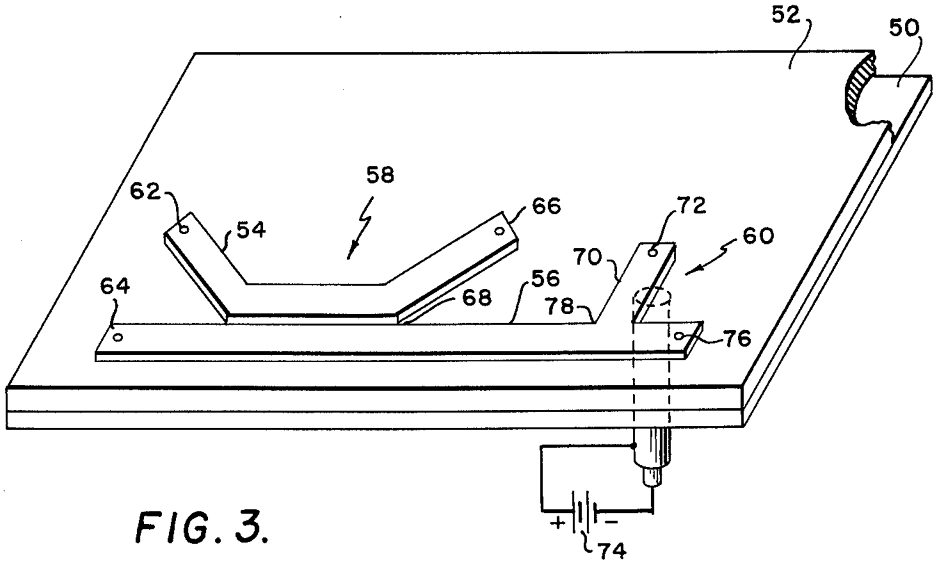
FIG. 3 is a perspective drawing, partially broken out, and showing the amplifier in strip-line form.

Another embodiment of the invention which uses parallel strip lines for transmission lines rather than the coaxial wave guide of FIG. 1, is shown in FIG. 3. In the embodiment of FIG. 3, 50 is a metal ground plate which may be of copper. Base 52 is a dielectric material such as "Teflon" which is plated on top of the metal ground plate 50, the conducting strips 54 and 56 which may also be of copper cooperate with the base plate 50 to form the strip transmission lines. These lines form a directional coupler indicated generally at 58 and an expander indicated generally at 60.

The wave guide 54 contains a coaxial connector 62 for the radio frequency power supply and the wave guide 56 contains a coaxial connector 64 for the input signal. A resistor 66 is mounted underneath the strip lines 54 to provide a reflectionless termination. The two wave guides 54 and 56 are electrically and magnetically coupled across the gap 68 for a portion of their length that is equal to one-quarter of the wave length of the input signals.

The expander 60 is comprised of the wave guide 56 and the branch line 70. The branch line 70 is one-quarter of the wave length long and has mounted at its far end diode holder 72. The diode holder 72 provides a connection between the strip line 70 and the cathode of the diode. The anode of the diode is connected to the negative pole of battery 74; the positive pole of battery 74 is connected to the ground plate 50 through the diode holder 72. The output from the expander is taken from coaxial connector 76.

The strip line amplifier of FIG. 3 operates in the same manner as the coaxial-cable amplifier of FIG. 1. The directional coupler 58 transfers a level P of radio frequency power to the wave guide 56. The input signal, Q, and another quantity of power, which is related to the square root of the input signal times the base of power transferred to 64, $\sqrt{PQ}$, is superimposed on this first basic level of radio frequency power. This amplified radio frequency signal is transferred to the expander 60. The expander 60 provides non-linear attenuation of this signal such that the first basic level of radio frequency power is attenuated to a negligible output but the superimposed input signal and the gain related to the production of the input signal and the radio frequency base is attenuated to a lesser degree to provide amplification at the terminal 76.

The non-linear attenuation of the expander 60 can be explained in terms of changes in the terminal impedance of quarter wave length line 70. As is well known, the input impedance at junction 78 a quarter wave-length branch line 70 will be the inverse of its terminating resistance. Therefore, when the radio frequency input to the expander is of such a low value that the diode 32 will not conduct, the input impedance of branch line 70 will appear as a short circuit at junction 78. This will cause the input radio frequency energy to be reflected and the expander 60 will have a high attenuation. However, when the radio frequency power input is increased such that the diode 32 is driven into conduction, the input impedance of branch line 70 at junction 78 will appear to be infinite and the input signal will be subject to a much reduced attenuation.

Obviously many modifications and variations of the present invention are possible in the light of the above teachings. It is therefore to be understood that within the scope of the appended claims the invention may be practiced otherwise than as specifically described.

What is claimed is:

1. A solid state microwave amplifier comprising:
   (a) a directional coupler including two waveguides, each of said waveguides having an input terminal and a flat side portion;
   (b) a source of power of the same frequency and phase as an input signal to said amplifier;
   (c) said input signal being applied to one input terminal of said directional coupler and said source of power being applied to the other of said input terminals, said directional coupler through the superposition of electric fields providing an output power which is equal to a value P, in the absence of an input signal, and equal to a larger value of power in the presence of an input signal of power Q;
   (d) an expander circuit electrically connected to said directional coupler so as to receive the output power from said directional coupler at its input;
   (e) means biasing said expander circuit providing a non-linear power amplified system output signal in the presence of input signal Q at the coupler.

2. A solid state microwave amplifier according to claim 1, in which said directional coupler is comprised of:
   (a) a first wave guide having an input terminal for connection to said power supply and a reflectionless termination; and
   (b) a second wave guide having an input terminal for connection to said input signal and having an output terminal for connection to said expander circuit;
   (c) said first and second wave guides being coupled together such that power may be transferred from said first wave guide to said second wave guide.

3. A solid state microwave amplifier according to claim 2, in which the electric and magnetic fields couple the first and second wave guides through a common aperture which is as long as a quarter of the wave length of the input RF power signal.

4. A solid state microwave amplifier according to claim 1, in which said expander circuit comprises:
   (a) a main RF waveguide transmission line;
   (b) a branch line connected to said main transmission line;
   (c) said branch line being an odd number of quarter wavelengths of said input signal long; and
   (d) a diode terminating said branch line and said biasing means providing reverse bias for said diode.

5. A solid state microwave amplifier according to claim 4, in which said diode is a Zener diode.

6. A solid state microwave amplifier with millimicrosecond rise time comprising:
   (a) a source of RF power of the same frequency and phase as an input signal to said amplifier;
   (b) a transmitting means having an input terminal for receiving said input signal;
   (c) a coupler including two waveguides, each of said waveguides having a flat side portion, for combining said RF power and said input signal to produce a power output having a portion which varies with said RF power and said input signal; and
   (d) a nonlinear attenuating means connected to said coupler, whereby low power levels from said coupler are attenuated to a greater extent than higher power levels.

7. A solid state microwave amplifier with millimicrosecond rise time according to claim 6, in which said nonlinear attenuating means comprises:
   (a) a main RF waveguide transmission line;
   (b) a branch line connected to said main transmission line;
   (c) said branch line being an odd number of quarter wavelengths of said input signal long; and
   (d) a diode terminating said branch line and biased in the reverse direction.

8. A solid state microwave amplifier with millimicrosecond rise time according to claim 7, in which said coupler is terminated in its characteristic impedance so as to prevent standing waves.

9. A solid state microwave amplifier with millimicrosecond rise time according to claim 8, in which said transmitting means and coupler are coupled by both electric and magnetic fields such that the waves from the electric and magnetic fields are out of phase when traveling towards the input terminal and in phase when traveling towards the nonlinear attenuating means.

References Cited by the Examiner

UNITED STATES PATENTS

| | | | |
|---|---|---|---|
| 2,743,322 | 4/1956 | Pierce et al. | 330—5 |
| 2,751,556 | 6/1956 | Tomiyasu et al. | 333—7 |
| 2,950,442 | 8/1960 | Scovil et al. | 330—5 |
| 3,048,794 | 8/1962 | Ares | 330—43 |
| 3,080,530 | 3/1963 | Smith | 307—88.5 |
| 3,119,080 | 1/1964 | Watters | 307—88.5 |
| 3,127,567 | 3/1964 | Chang | 307—88.5 |
| 3,166,713 | 1/1965 | Chang et al. | 307—88.5 |

OTHER REFERENCES

Microwave Theory and Techniques, by Van Nostrand, 1953, pp. 136–137.

IRE Transactions on Microwave Theory and Techniques, "Microwave Switching by Crystal Diodes," by Millet, July 1958, pp. 284–290 relied on.

JOHN W. HUCKERT, *Primary Examiner.*

NATHAN KAUFMAN, *Examiner.*

J. D. CRAIG, *Assistant Examiner.*